(12) United States Patent
Breitwisch et al.

(10) Patent No.: US 7,985,654 B2
(45) Date of Patent: Jul. 26, 2011

(54) PLANARIZATION STOP LAYER IN PHASE CHANGE MEMORY INTEGRATION

(75) Inventors: Matthew J. Breitwisch, Yorktown Heights, NY (US); Yu Zhu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 12/559,115

(22) Filed: Sep. 14, 2009

(65) Prior Publication Data

US 2011/0062559 A1 Mar. 17, 2011

(51) Int. Cl.
*H01L 21/76* (2006.01)

(52) U.S. Cl. ........ 438/422; 438/102; 438/619; 257/522; 257/E21.573

(58) Field of Classification Search ................... 438/422, 438/421, 411, 95, 102, 619; 257/522
See application file for complete search history.

(56) References Cited

U.S. PATENT DOCUMENTS

| | | | | |
|---|---|---|---|---|
| 6,407,002 B1 * | 6/2002 | Lin et al. | ......... | 438/713 |
| 7,038,289 B2 * | 5/2006 | Marty et al. | ......... | 257/501 |
| 7,732,891 B2 * | 6/2010 | Tanaka et al. | ......... | 257/522 |
| 2008/0061341 A1 * | 3/2008 | Lung | ......... | 257/303 |
| 2008/0138929 A1 | 6/2008 | Lung | | |
| 2008/0138931 A1 | 6/2008 | Lung | | |
| 2009/0298223 A1 * | 12/2009 | Cheek et al. | ......... | 438/102 |

OTHER PUBLICATIONS

M. Breitwisch, et al., "Novel Lithography-Independent Pore Phase Change Memory", 2007 Symposium on VLSI Technology Digest of Technical Papers, pp. 100-101.

* cited by examiner

*Primary Examiner* — Charles D Garber
*Assistant Examiner* — Reema Patel
(74) *Attorney, Agent, or Firm* — Cantor Colburn LLP; Vazken Alexanian

(57) ABSTRACT

A key hole structure and method for forming a key hole structure to form a pore in a memory cell. The method includes forming a first dielectric layer on a semiconductor substrate having an electrode formed therein, forming an isolation layer on the first dielectric layer, forming a second dielectric layer on the isolation layer, and forming a planarization stop layer on the second dielectric layer. The method further includes forming a via to extend to the first dielectric layer and recessing the isolation layer and the stop layer with respect to the second dielectric layer, depositing a conformal film within via and over the stop layer, forming a key hole within the conformal film at a center region of the via such that a tip of the key hole is disposed at an upper surface of the second dielectric layer, and planarizing the conformal film to the stop layer.

24 Claims, 3 Drawing Sheets

PLANARIZATION STOP LAYER IN PHASE CHANGE MEMORY INTEGRATION

BACKGROUND

The present invention relates generally to phase change memory cells, and more specifically, to a planarization stop layer for forming a phase change memory device.

Phase change material (PCM) has a variety of applications in microelectronic devices such as optical storage media and solid state phase change memory devices. Phase change random access memory (PRAM) devices, for example, store data using a phase change material, such as, for example, a chalcogenide alloy, that transforms into a crystalline state or an amorphous state during cooling after a heat treatment. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1". A current passed through the phase change material creates ohmic heating and causes the phase change material to melt. Melting and gradually cooling down the phase change material allows time for the phase change material to form the crystalline state. Melting and abruptly cooling the phase change material quenches the phase change material into the amorphous state.

Pore integration provides a uniform and sub-lithographic patterning for PCM application. Conventionally, a key hole method is performed to form a pore within phase change memory cell. FIG. 1 illustrates a conventional key hole method. In FIG. 1, a substrate 10 including a bottom electrode 12 is provided. A first dielectric layer 14 is formed on the substrate 10, an isolation layer 16 is formed on the first dielectric layer 14, and a second dielectric layer 18 is formed on the isolation layer 16. A photo resist layer (not shown) is formed over the second dielectric layer 18. A via 20 is formed to extend to the first dielectric layer 14. Next, the photo resist layer is removed and the isolation layer 16 is recessed, creating overhang portions of the second dielectric layer 18. A conformal film 22 e.g., an amorphous silicon layer is deposited within the via 20 and pinched to form a void (i.e., a keyhole 24) in the via 20. Typically, the conformal film 22 is recessed and the keyhole 24 is transferred down into the first dielectric layer 16 by a reactive ion etching (RIE) operation, to form a pore. There are variations in center to edge thickness of the conformal film 22 due to the nature of the process. The difference in the conformal film 22 thickness can be coupled into the pore diameter and depth formed during the RIE process, causing the CD variation. A planarization operation e.g., a silicon chemical mechanical polishing (CMP) operation is typically used to attempt to improve the uniformity across the wafer prior to the performance of the RIE process. However, when the CMP operation is performed it may cause a tip 24a of the key hole 24 to open, thereby causing CMP slurry to get into the key hole 24 and block the RIE process for transferring the key hole 24 to the first dielectric layer 14 to form the pore.

SUMMARY

The present invention obviates the above-mentioned problems, by providing a method which includes forming a planarization stop layer e.g., a chemical mechanical polishing (CMP) stop layer for forming a phase change memory device. The CMP stop layer stops the CMP before it approaches a tip of the key hole formed within the conformal film.

According to an embodiment of the present invention, a method for forming a key hole structure to form a pore in a memory cell is provided. The method includes forming a first dielectric layer on a semiconductor substrate having an electrode formed therein, forming an isolation layer on the first dielectric layer, forming a second dielectric layer on the isolation layer, and forming a planarization stop layer on the second dielectric layer. The method further includes forming a via to extend to the first dielectric layer and recessing the isolation layer and the planarization stop layer with respect to the second dielectric layer, depositing a conformal film within via and over the planarization stop layer, forming a key hole within the conformal film at a center region of the via such that a tip of the key hole is disposed at an upper surface of the second dielectric layer, and planarizing the conformal film to the planarization stop layer.

According to another embodiment of the present invention, a method for forming a pore in a memory cell is provided. The method includes forming a first dielectric layer on a semiconductor substrate having an electrode formed therein, forming an isolation layer on the first dielectric layer, forming a second dielectric layer on the isolation layer, and forming a planarization stop layer on the second dielectric layer. The method further includes forming a via to extend to the first dielectric layer and recessing the isolation layer and the planarization stop layer with respect to the second dielectric layer, depositing a conformal film within via and over the planarization stop layer, forming a key hole within the conformal film at a center region of the via such that a tip of the key hole is disposed at an upper surface of the second dielectric layer, planarizing the conformal film to the planarization stop layer, and etching the conformal film and transferring the key hole to the first dielectric layer to form a pore within the first dielectric layer.

According to yet another embodiment of the present invention, a key hole structure for forming a pore cell within a memory cell is provided. The key hole structure includes a first dielectric layer on a semiconductor substrate having an electrode formed therein, an isolation layer formed on the first dielectric layer, a second dielectric layer formed on the isolation layer, a planarization stop layer formed on the second dielectric layer, the isolation layer and the planarization stop layer recessed with respect to the second dielectric layer, and a via extending to the first dielectric layer. The via having a conformal film deposited therein and including a key hole within the conformal film at a center region of the via such that a tip of the key hole is disposed at an upper surface of the second dielectric layer. The conformal film is planarized to an upper surface of the planarization stop layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 2:
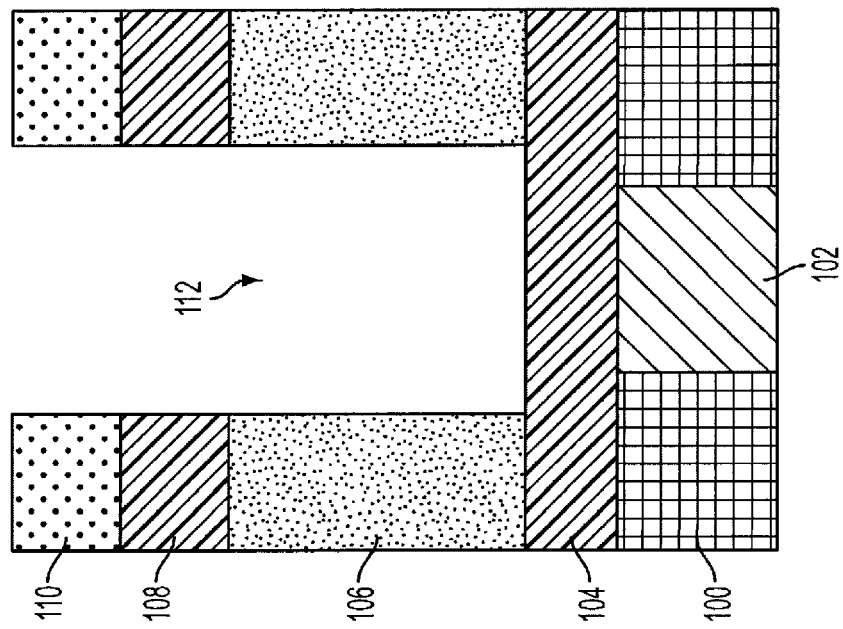
FIG. 2 is a diagram illustrating a fabrication operation of a key hole structure that can be implemented within embodiments of the present invention.
Figure 1:
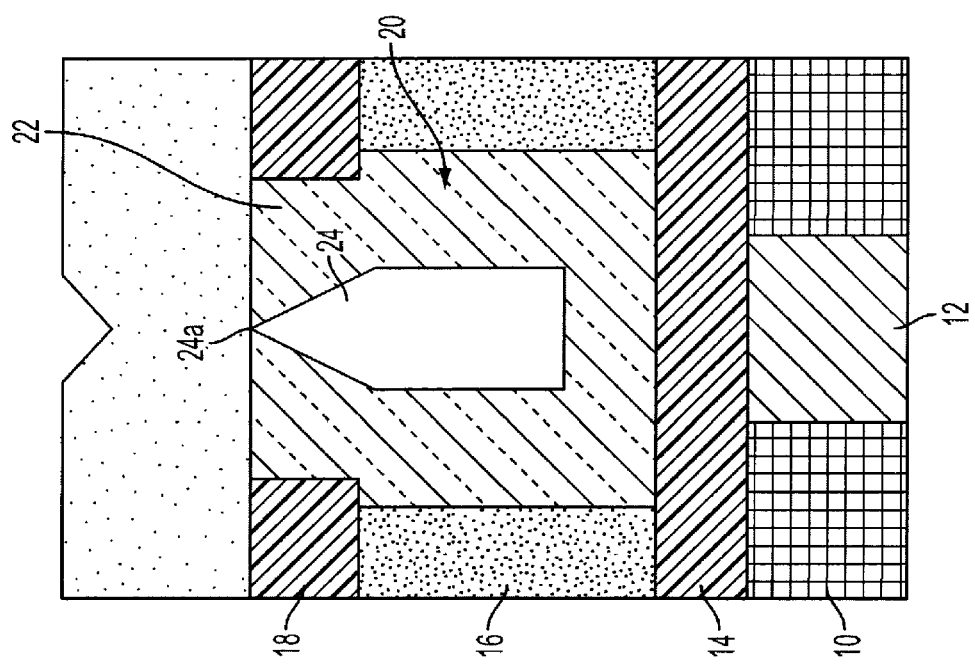
FIG. 1 is a diagram illustrating a conventional key hole method.

The present invention provides a key hole structure and method for forming a key hole structure used to form a pore of a phase change memory cell. With reference now to FIG. 2, a substrate 100 including a bottom electrode 102 is provided. The bottom electrode 102 may be formed of titanium nitride (TiN) or tungsten (W), for example. The bottom electrode 102 is connected to access circuitry (not shown) such as an access transistor or diode. A first dielectric layer 104 is formed on the substrate 100 and an isolation layer 106 is formed on the first dielectric layer 104. According to an embodiment of the present invention, the first dielectric layer 104 may be formed of silicon nitride (SiN), for example. The isolation layer 106 may be formed of silicon dioxide ($SiO_2$), for example. Further, shown in FIG. 2, a second dielectric layer 108 is formed on the isolation layer 106. The second dielectric layer 108 may be formed of silicon nitride (SiN), for example. An alternative material for the second dielectric layer may be titanium nitride (TiN). The choice of the materials is based on the material system. For instance, if silicon dioxide ($SiO_2$) is used for the first dielectric layer 104, and silicon (Si) for the isolation layer 106, then silicon dioxide ($SiO_2$) may be used for the second dielectric layer 108 as well. As long as the wet etch can selectively recess the isolation layer 106 and the planarization stop layer 110, and not the second dielectric layer 108 and the first dielectric layer 104.

Also shown in FIG. 2, a third dielectric layer 110 e.g., a planarization stop layer 110 is formed on the second dielectric layer 108. According to an embodiment of the present invention, the planarization stop layer 110 may be formed of a low temperature silicon nitride (SiN), silicon dioxide ($SiO_2$), oxy-nitride, oxide or other suitable material that has a faster buffered oxide etch (BOE) etch rate compared to approximately 400 degree Celsius silicon nitride (SiN). According to an embodiment of the present invention, the planarization stop layer 110 is formed of a material having a faster etch rate than that of the second dielectric layer 108 and a similar etch rate as that of the isolation layer 106. According to one embodiment of the present invention, the second dielectric layer 108 and the planarization stop layer 110 may both be formed of silicon nitride (SiN) based on different deposition conditions (e.g., temperature) thereby having different etch rates. For example, the second dielectric layer 108 may be formed of silicon nitride (SiN) formed at a 400 degree Celsius processing temperature and the planarization stop layer 110 may be formed of silicon nitride (SiN) formed at a 200 degree Celsius processing temperature. According to an embodiment of the present invention, the planarization stop layer 110 may be of a predetermined thickness equal to or greater than that of the second dielectric layer 108. For example, the second dielectric layer 108 may be of a predetermined thickness of approximately 30 nanometers (nm) while the planarization stop layer 110 may be of a predetermined thickness of approximately 30 nanometers (nm) or greater. According to another embodiment of the present invention, the second dielectric layer 108 may be of a predetermined thickness ranging from approximately 10 nanometers (nm) to 50 nanometers (nm) and the planarization stop layer 110 may be of a predetermined thickness ranging from approximately 30 nanometers (nm) to approximately 60 nanometers (nm). Further, in FIG. 2, a via 112 is formed extending to the first dielectric layer 104 using lithographic techniques. According to an embodiment of the present invention, a minimum thickness of the planarization stop layer 110 ("third dielectric layer") is determined by the material recess amount after wet etch and CMP stop range. The thickness of the third dielectric layer should not be too thick that it changes the aspect ratio of the via 112 and changes the subsequent conformal film deposition profile.

Figure 3:
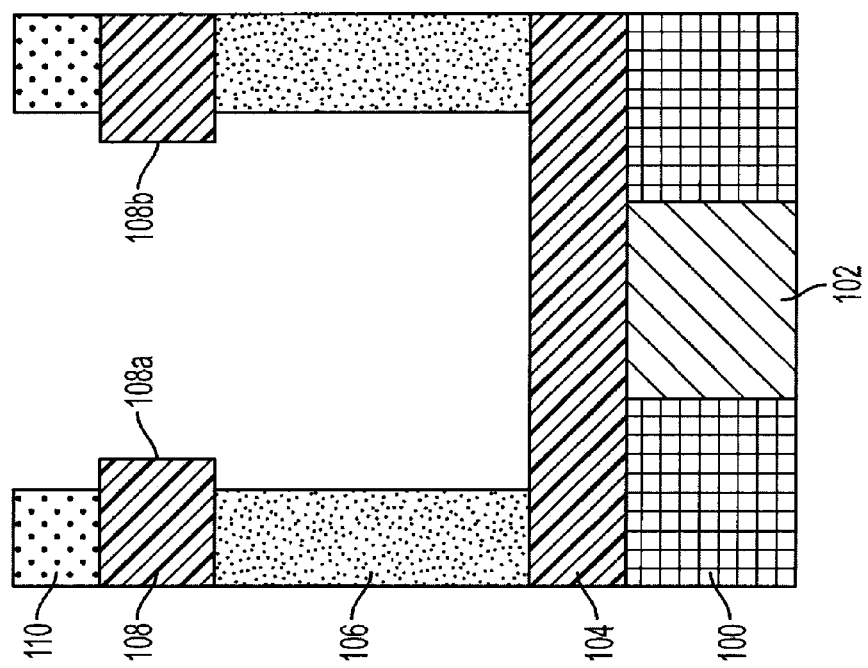
FIG. 3 is a diagram illustrating a recessing operation of a via that can be implemented within embodiments of the present invention.

FIG. 3 is a diagram illustrating a recessing operation of the via 112 that can be implemented within embodiments of the present invention. In FIG. 3, according to an embodiment of the present invention, since the isolation layer 106 and the planarization stop layer 110 have a similar etch rate, both are recessed a predetermined distance when an etching operation is performed, for example, a 500:1 buffered oxide etch (BOE) operation, thereby creating overhang portions 108a, 108b of the second dielectric layer 108. The present invention is not limited to any particular type of etching process and may vary accordingly. As shown in FIG. 3, the isolation layer 106 and the third dielectric layer 110 may be etched back at approximately a same predetermined distance. In the case of forming a 30 nanometers (nm) key hole, the isolation layer 106 may be etched back approximately 15 nanometers (nm) on each side while the third dielectric layer 110 is etched back approximately 5 to 10 nanometers (nm) on each side. Next, the deposition of a conformal film is described below with reference to FIG. 4.

Figure 4:
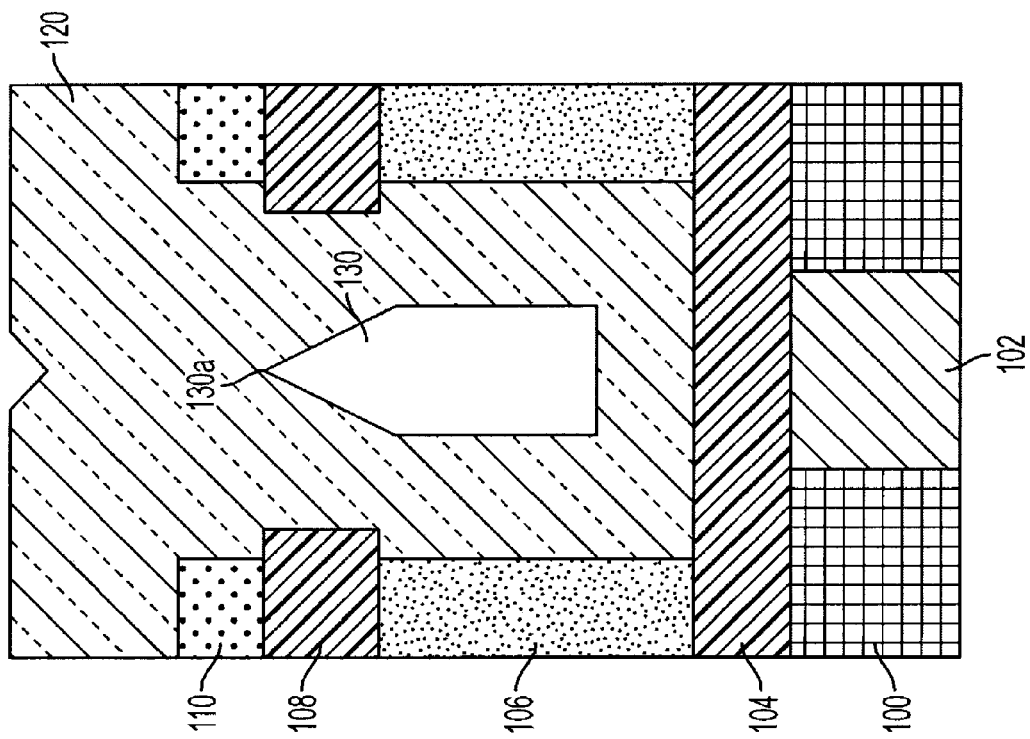
FIG. 4 is a diagram illustrating deposition operation of a conformal film that can be implemented within embodiments of the present invention.

FIG. 4 is a diagram illustrating a deposition operation of a conformal film that can be implemented within embodiments of the present invention. As shown in FIG. 4, a conformal film 120 is deposited within the via 112 and pinched to form a void (i.e., a key hole 130) in the via 112. The conformal film 120 may be made of amorphous silicon (a-Si) or polysilicon, for example. The conformal film 120 may be deposited by a chemical vapor deposition (CVD) or atomic layer deposition (ALD) deposition, for example or any other suitable deposition process. As shown in FIG. 4, a tip 130a of the key hole 130 is formed at an upper surface of the second dielectric layer 108.

Figure 6:
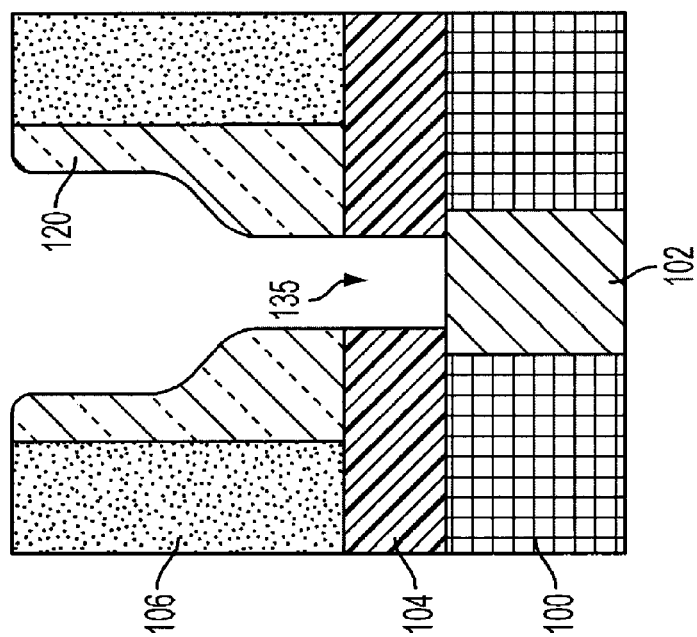
FIG. 6 is a diagram illustrating the formation of a pore that can be implemented within embodiments of the present invention.
Figure 5:
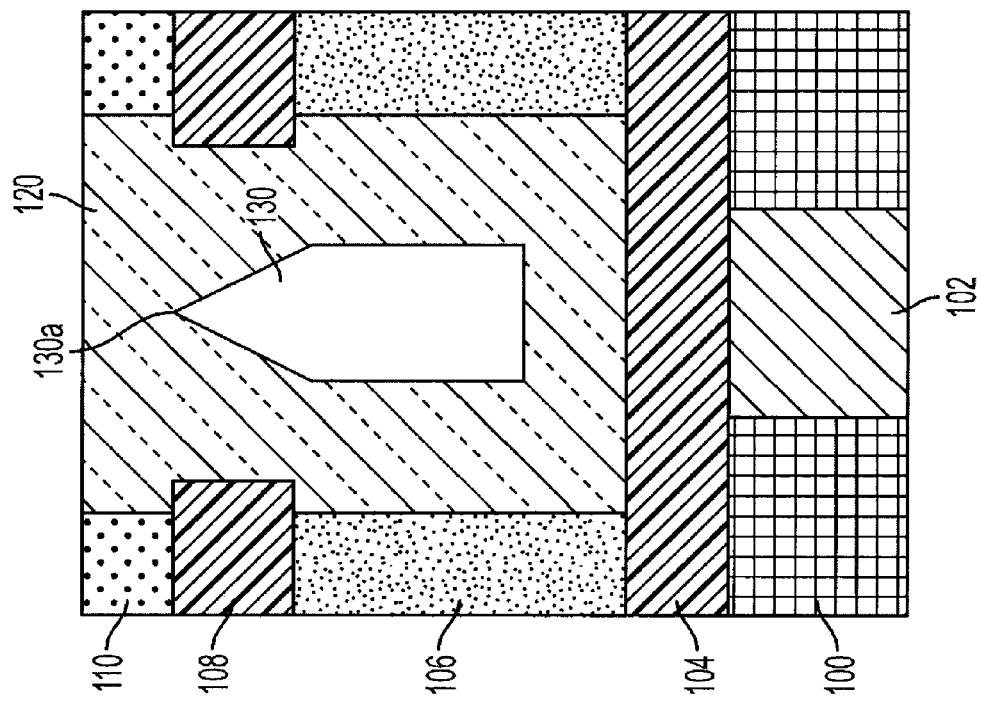
FIG. 5 is a diagram illustrating a planarization operation of the conformal film shown in FIG. 4 that can be implemented within embodiments of the present invention.

FIG. 5 is a diagram illustrating a planarization operation of the conformal film shown in FIG. 4 that can be implemented within embodiments of the present invention. As shown in FIG. 5, the conformal film 120 is polished via a chemical mechanical polishing (CMP) process, for example, to an upper surface of the planarization stop layer 110. Therefore, during the CMP process, the planarization stop layer 110 acts as a CMP stop layer to stop the CMP before it approaches the tip 130a of the key hole 130. Since the tip 130a of the key hole 130 is formed at the upper surface of the second dielectric layer 108, the tip 130a remains closed and CMP slurry does not enter the key hole 130 and block a subsequent reactive ion etching (RIE) process (as depicted in FIG. 6) for transferring the key hole 130 to the first dielectric layer 104 to form a pore of a memory cell. The formation of a pore of a memory cell will now be described below with reference to FIG. 6.

FIG. 6 is a diagram illustrating the formation of a pore that can be implemented within embodiments of the present invention. As shown in FIG. 6, the conformal film 120 is recessed via a RIE process and the keyhole 130 is transferred down into the first dielectric layer 106 to form a pore 135 of a memory cell.

Further, phase change material (not shown) is then deposited within the pore 135 and a top electrode is formed on the phase change material, resulting in the formation of a phase change memory cell. According to an embodiment of the present invention, the pore 135 may be filled with TiN or W to form the sub-lithography diameter bottom electrode for mushroom phase change memory cell.

Embodiments of the present invention provide a key hole structure and method for forming a key hole structure to form a pore of a memory cell. The present invention uses a planarization stop layer which provides the advantage of forming a key hole structure that prevents CMP slurry from approaching a tip of the key hole thereby preventing interference of a key hole transfer during a RIE process for forming a pore within a memory cell. The present invention further minimizes the time of the RIE process which contributes to the non-uniformity across the wafer, thereby improving the uniformity across the wafer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a key hole structure to form a pore in a memory cell, the method comprising:
    forming a first dielectric layer on a semiconductor substrate having an electrode formed therein;
    forming an isolation layer on the first dielectric layer;
    forming a second dielectric layer on the isolation layer;
    forming a planarization stop layer on the second dielectric layer;
    forming a via to extend to the first dielectric layer and recessing the isolation layer and the planarization stop layer with respect to the second dielectric layer;
    depositing a conformal film within via and over the planarization stop layer;
    forming a key hole within the conformal film at a center region of the via such that a tip of the key hole is disposed at an upper surface of the second dielectric layer; and
    planarizing the conformal film to the planarization stop layer.

2. The method of claim 1, wherein the planarization stop layer is formed of at least one of a low temperature silicon nitride (SiN), silicon dioxide ($SiO_2$), oxy-nitride, oxide or other suitable material having a faster buffered oxide etch (BOE) etch rate than approximately 400 degree Celsius silicon nitride (SiN).

3. The method of claim 1, wherein the planarization stop layer is formed of a material having a faster etch rate than that of the second dielectric layer and a similar etch rate as that of the isolation layer.

4. The method of claim 1, wherein the second dielectric layer and the planarization stop layer are formed of silicon nitride (SiN) based on different deposition conditions having different etch rates.

5. The method of claim 4, wherein the second dielectric layer is formed of silicon nitride (SiN) formed at a 400 degree Celsius processing temperature and the planarization stop layer is formed of silicon nitride (SiN) formed at a 200 degree Celsius processing temperature.

6. The method of claim 1, wherein the planarization stop layer is formed of a predetermined thickness equal to or greater than that of the second dielectric layer.

7. The method of claim 1, wherein the second dielectric layer is formed of a predetermined thickness ranging from approximately 10 nanometers (nm) to 50 nanometers (nm).

8. The method of claim 7, wherein the planarization stop layer is formed of a predetermined thickness ranging from approximately 30 nanometers (nm) to approximately 60 nanometers (nm).

9. A method for forming a pore in a memory cell, the method comprising:
    forming a first dielectric layer on a semiconductor substrate having an electrode formed therein;
    forming an isolation layer on the first dielectric layer;
    forming a second dielectric layer on the isolation layer;
    forming a planarization stop layer on the second dielectric layer;
    forming a via to extend to the first dielectric layer and recessing the isolation layer and the planarization stop layer with respect to the second dielectric layer;
    depositing a conformal film within via and over the planarization stop layer;
    forming a key hole within the conformal film at a center region of the via such that a tip of the key hole is disposed at an upper surface of the second dielectric layer;
    planarizing the conformal film to the planarization stop layer; and etching the conformal film and transferring the key hole to the first dielectric layer to form a pore within the first dielectric layer.

10. The method of claim 9, wherein the planarization stop layer is formed of at least one of a low temperature silicon nitride (SiN), silicon dioxide (SiO$_2$), oxy-nitride, oxide or other suitable material having a faster buffered oxide etch (BOE) etch rate than approximately 400 degree Celsius silicon nitride (SiN).

11. The method of claim 9, wherein the planarization stop layer is formed of a material having a faster etch rate than that of the second dielectric layer and a similar etch rate as that of the isolation layer.

12. The method of claim 9, wherein the second dielectric layer and the planarization stop layer are formed of silicon nitride (SiN) based on different deposition conditions having different etch rates.

13. The method of claim 12, wherein the second dielectric layer is formed of silicon nitride (SiN) formed at a 400 degree Celsius processing temperature and the planarization stop layer is formed of silicon nitride (SiN) formed at a 200 degree Celsius processing temperature.

14. The method of claim 9, wherein the planarization stop layer is formed of a predetermined thickness equal to or greater than that of the second dielectric layer.

15. The method of claim 9, wherein the second dielectric layer is formed of a predetermined thickness ranging from approximately 10 nanometers (nm) to 50 nanometers (nm).

16. The method of claim 15, wherein the planarization stop layer is formed of a predetermined thickness ranging from approximately 30 nanometers (nm) to approximately 60 nanometers (nm).

17. A key hole structure for forming a pore in a memory cell, comprising:
 a first dielectric layer on a semiconductor substrate having an electrode formed therein;
 an isolation layer formed on the first dielectric layer;
 a second dielectric layer formed on the isolation layer;
 a planarization stop layer formed on the second dielectric layer, the isolation layer and the planarization stop layer recessed with respect to the second dielectric layer;
 a via extending to the first dielectric layer and having a conformal film deposited therein and including a key hole within the conformal film at a center region of the via such that a tip of the key hole is disposed at an upper surface of the second dielectric layer, wherein the conformal film is planarized to an upper surface of the planarization stop layer.

18. The structure of claim 17, wherein the planarization stop layer is formed of at least one of a low temperature silicon nitride (SiN), silicon dioxide (SiO$_2$), oxy-nitride, oxide or other suitable material having a faster buffered oxide etch (BOE) etch rate than approximately 400 degree Celsius silicon nitride (SiN).

19. The structure of claim 17, wherein the planarization stop layer is formed of a material having a faster etch rate than that of the second dielectric layer and a similar etch rate as that of the isolation layer.

20. The structure of claim 17, wherein the second dielectric layer and the planarization stop layer are formed of silicon nitride (SiN) based on different deposition conditions having different etch rates.

21. The structure of claim 20, wherein the second dielectric layer is formed of silicon nitride (SiN) formed at a 400 degree Celsius processing temperature and the planarization stop layer is formed of silicon nitride (SiN) formed at a 200 degree Celsius processing temperature.

22. The structure of claim 17, wherein the planarization stop layer is formed of a predetermined thickness equal to or greater than that of the second dielectric layer.

23. The structure of claim 17, wherein the second dielectric layer is formed of a predetermined thickness ranging from approximately 10 nanometers (nm) to 50 nanometers (nm).

24. The structure of claim 23, wherein the planarization stop layer is formed of a predetermined thickness ranging from approximately 30 nanometers (nm) to approximately 60 nanometers (nm).

* * * * *